United States Patent
Shimizu et al.

(10) Patent No.: US 6,985,030 B2
(45) Date of Patent: Jan. 10, 2006

(54) DIFFERENTIAL AMPLIFIER, TWO-STAGE AMPLIFIER INCLUDING THE DIFFERENTIAL AMPLIFIER, AND ANALOG-TO-DIGITAL CONVERTER INCLUDING THE DIFFERENTIAL AMPLIFIER

(75) Inventors: Yasuhide Shimizu, Nagasaki (JP); Hideyuki Katsuta, Nagasaki (JP); Yukitoshi Yamashita, Nagasaki (JP); Nobuhiko Yokoyama, Nagasaki (JP)

(73) Assignee: Sony Corporation, Tokyo (JP)

( * ) Notice: Subject to any disclaimer, the term of this patent is extended or adjusted under 35 U.S.C. 154(b) by 37 days.

(21) Appl. No.: 10/818,791

(22) Filed: Apr. 6, 2004

(65) Prior Publication Data

US 2004/0201417 A1 Oct. 14, 2004

(30) Foreign Application Priority Data

Apr. 9, 2003 (JP) ............................ P2003-105689

(51) Int. Cl.
*H03F 1/02* (2006.01)
*H03M 1/12* (2006.01)

(52) U.S. Cl. .............................. 330/9; 330/69; 330/10; 341/155; 341/161

(58) Field of Classification Search .................... 330/9, 330/10, 69, 253, 257; 327/87, 67, 362, 36; 341/161, 172, 155
See application file for complete search history.

(56) References Cited

U.S. PATENT DOCUMENTS

| | | | |
|---|---|---|---|
| 5,614,853 A | | 3/1997 | Van Rens |
| 5,821,780 A | * | 10/1998 | Hasegawa .................... 327/63 |
| 5,847,670 A | | 12/1998 | Gratrex et al. |
| 5,892,375 A | | 4/1999 | Vulih et al. |
| 5,986,599 A | | 11/1999 | Matsuo |
| 6,049,246 A | * | 4/2000 | Kozisek et al. ................ 330/9 |
| 6,392,475 B1 | * | 5/2002 | Lee ............................... 330/9 |
| 6,429,697 B1 | | 8/2002 | Amazeen et al. |
| 6,753,801 B2 | * | 6/2004 | Rossi .......................... 341/161 |
| 6,909,391 B2 | * | 6/2005 | Rossi .......................... 341/161 |

* cited by examiner

*Primary Examiner*—Peguy Jeanpierre
*Assistant Examiner*—Lam T. Mai
(74) *Attorney, Agent, or Firm*—Sonnenschein, Nath & Rosenthal LLP

(57) ABSTRACT

A differential amplifier has an in-phase input terminal to which an input signal is applied through a first switching unit, an anti-phase input terminal to which a reference signal is applied through a second switching unit, and a third switching unit between the in-phase and anti-phase input terminals. The potential difference between the in-phase and anti-phase input terminals is differentially amplified by setting the first and second switching units to be on and the third switching unit to be off. Also, the in-phase and anti-phase input terminals are short-circuited to have a high impedance by setting the first and second switching units to be off and the third switching unit to be on.

2 Claims, 7 Drawing Sheets

DIFFERENTIAL AMPLIFIER, TWO-STAGE AMPLIFIER INCLUDING THE DIFFERENTIAL AMPLIFIER, AND ANALOG-TO-DIGITAL CONVERTER INCLUDING THE DIFFERENTIAL AMPLIFIER

BACKGROUND OF THE INVENTION

1. Field of the Invention

The present invention relates to a differential amplifier, a two-stage amplifier including the differential amplifier, and an analog-to-digital converter including the differential amplifier.

2. Description of the Related Art

With widespread use of digital devices, analog-to-digital converters that convert analog signals into digital signals have been widely used. In connection with high performance and reduction in size and price of digital devices of recent years, it is required for the analog-to-digital converters to have increased resolution, increased processing speed, and reduced power consumption.

The configuration of a basic analog-to-digital converter is described below.

As FIG. 10 shows, an analog-to-digital converter 100 includes a sample-and-hold unit 101 for sampling and holding an analog signal, a reference voltage generator 104 for generating a plurality of different reference voltages by dividing a reference voltage from a reference power supply 102 by using resistors 103 having equal resistances, a comparing unit 106 including a plurality of comparators 105 which each compare the voltage of the analog signal and each reference voltage, and a logic processor 107 for outputting a digital signal corresponding to the analog signal by performing logic processing on the outputs of the comparators 105.

As described above, in the analog-to-digital converter 100, the comparators 105 are connected in parallel to the sample-and-hold unit 101.

As FIG. 11 shows, a chopper comparator 110 including an amplifying circuit 108 whose input end connects to each sampling capacitor 109 is used as each comparator 105.

In other words, in the analog-to-digital converter 100, the sampling capacitors 109 are connected in parallel to the sample-and-hold unit 101 (See, for example, Japanese Unexamined Patent Application Publication No. 11-205144).

Since the analog-to-digital converter 100 of the related art includes the sampling capacitors 109 connected in parallel to the sample-and-hold unit 101, the connected sampling capacitors 109 serve as a load on the sample-and-hold unit 101. This makes it difficult to simultaneously realize increased performance and speed, and reduced power consumption of the analog-to-digital converter 100.

In other words, in order that an analog-to-digital converter using chopper comparators may have increased resolution, the number of chopper comparators must be increased while increasing the accuracy of each chopper comparator. The accuracy of the chopper comparator is dependent on the capacitance of sampling capacitors. Thus, the capacitances of the sampling capacitors in the chopper comparators must be increased. For increasing the accuracy, an increase in the capacitance of the sampling capacitor in each chopper comparator increases the load connected to the sample-and-hold unit. This causes a decrease in the processing speed of the analog-to-digital converter and an increase in the power consumption.

Accordingly, to reduce the power consumption of the analog-to-digital converter, it is possible that, direct supply of the analog signal to a differential amplification circuit prevent the sampling capacitors from being used.

When the analog signal is directly supplied to the differential amplification circuit, there is a possibility that conversion accuracy of the analog-to-digital converter may decrease since noise generated in the differential amplification circuit is superimposed on the analog signal.

Accordingly, it is necessary to provide the input end of the differential amplification circuit with a circuit for preventing the noise from being superimposed. This may cause circuit complexity and large circuit size. In particular, in a device that needs many differential amplifiers, such as the analog-to-digital converter, an increase in circuit size may enlarge the entire device.

SUMMARY OF THE INVENTION

It is an object of the present invention to provide a differential amplifier which has a circuit size reduced as much as possible and which prevents noise from being superimposed on an input side.

It is another object of the present invention to provide a reduced size device requiring a large number of differential amplifiers, such as an analog-to-digital converter, by using differential amplifiers of the above type.

It is another object of the present invention to provide an analog-to-digital converter having a high resolution, a high speed, and reduced power consumption which are simultaneously realized by using differential amplifiers of the above type.

According to an aspect of the present invention, a differential amplifier having thereon an in-phase input terminal and an anti-phase input terminal is provided. The differential amplifier includes a first switching unit provided on an input signal line connected to the in-phase input terminal, a second switching unit provided on a reference signal line connected to the anti-phase input terminal, and a third switching unit provided between the in-phase input terminal and the anti-phase input terminal.

Preferably, a difference in potential between the in-phase input terminal and the anti-phase input terminal is differentially amplified by setting the first switching unit and the second switching unit to be on and the third switching unit to be off, and the in-phase input terminal and the anti-phase input terminal are short-circuited to have a high impedance by setting the first switching unit and the second switching unit to be off and the third switching unit to be on.

According to another aspect of the present invention, a two-stage amplifier having an offset-compressing function is provided. The two-stage amplifier includes a prestage differential amplifier and a poststage differential amplifier which are connected in series to each other. The offset-compressing function compresses an offset voltage of the prestage differential amplifier by increasing the gain of the poststage differential amplifier. The prestage differential amplifier has thereon an in-phase input terminal and an anti-phase input terminal, and includes a first switching unit provided on an input signal line connected to the in-phase input terminal, a second switching unit provided on a reference signal line connected to the anti-phase input terminal, and a third switching unit provided between the in-phase input terminal and the anti-phase input terminal.

Preferably, a difference in potential between the in-phase input terminal and the anti-phase input terminal is differentially amplified by setting the first switching unit and the second switching unit to be on and the third switching unit to be off, and the in-phase input terminal and the anti-phase input terminal are short-circuited to have a high impedance by setting the first switching unit and the second switching unit to be off and the third switching unit to be on.

According to another aspect of the present invention, an analog-to-digital converter is provided which includes a plurality of amplifying unit. In the analog-to-digital converter, an input signal is converted into digital form by amplifying differences between an input signal and each of a plurality of different reference signals. Each of the plurality of amplifying unit is a two-stage amplifier including a prestage differential amplifier and a poststage differential amplifier which are connected in series to each other, and having an offset-compressing function for compressing an offset voltage of the prestage differential amplifier by increasing the gain of the poststage differential amplifier. The prestage differential amplifier has thereon an in-phase input terminal and an anti-phase input terminal, and includes a first switching unit provided on an input signal line connected to the in-phase input terminal, a second switching unit provided on a reference signal line connected to the anti-phase input terminal, and a third switching unit provided between the in-phase input terminal and the anti-phase input terminal.

Preferably, in the analog-to-digital converter, a difference in potential between the in-phase input terminal and the anti-phase input terminal is differentially amplified by setting the first switching unit and the second switching unit to be on and the third switching unit to be off, and the in-phase input terminal and the anti-phase input terminal are short-circuited to have a high impedance by setting the first switching unit and the second switching unit to be off and the third switching unit to be on.

DESCRIPTION OF THE PREFERRED EMBODIMENTS

Embodiments of the present invention are described below with reference to the accompanying drawings.

The embodiments are directed to a case in which a differential amplifier is applied to an analog-to-digital converter. In this description, an example of the analog-to-digital converter is a sub-ranging analog-to-digital converter which has a total of four bits and which converts an analog signal into upper two bits of a digital signal and subsequently converts lower two bits of the digital signal. However, specific embodiments of the present invention are not limited to types of the sub-ranging analog-to-digital converter.

Figure 1:
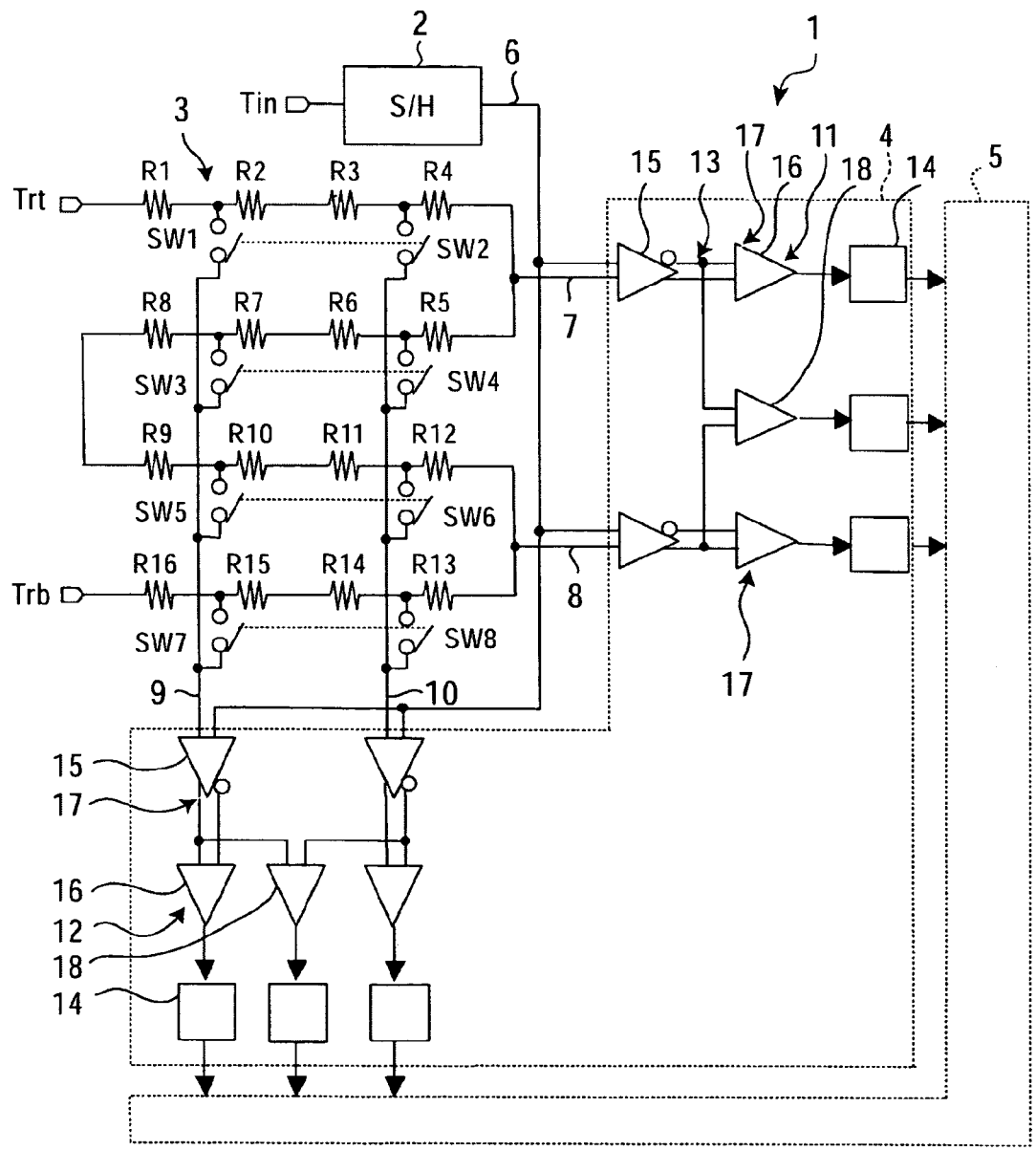
FIG. 1 is a circuit diagram showing an analog-to-digital converter according to an embodiment of the present invention.

As FIG. 1 shows, an analog-to-digital converter 1 according to an embodiment of the present invention includes a sample-and-hold unit 2 for sampling and holding an analog signal, a reference voltage generating unit 3 for generating a plurality of different reference voltages, a comparing unit 4 for comparing the voltage of the analog signal with the different reference voltages, and a logic processing unit 5 for outputting a digital signal corresponding to the analog signal by performing logic processing on outputs from the comparing unit 4.

The sample-and-hold unit 2 can hold the voltage of an analog signal applied to an input terminal $T_{in}$ for a predetermined period and can output the voltage of the analog signal to a hold signal line 6.

The reference voltage generating unit 3 generates a plurality of reference voltages by using sixteen resistors R1 to R16 which have equal resistances and which are connected in series between a high-side reference power supply $T_{rt}$ for supplying a high side reference potential and a low-side reference power supply $T_{rb}$ for generating a low side reference potential, and dividing the voltage between the high side reference potential and the low side reference potential by using the sixteen resistors R1 to R16. The reference voltages are output from upper-bit reference-signal lines 7 and 8, or from lower-bit reference-signal lines 9 and 10.

Specifically, in the reference voltage generating unit 3, the upper-bit reference-signal lines 7 and 8, which output upper bit reference voltages, are respectively connected to the point between the fourth resistor R4 and fifth resistor R5 from the high-side reference power supply $T_{rt}$ and the point between the fourth resistor R13 and fifth resistor R12 from the low-side reference power supply $T_{rb}$. Switches SW1 and SW2 which cooperatively link the lower-bit reference-signal lines 9 and 10 are respectively connected to the point between the first resistor R1 and second resistor R2 from the high-side reference power supply $T_{rt}$ and to the point between the third resistor R3 and fourth resistor R4 from the high-side reference power supply $T_{rt}$. The lower-bit reference-signal lines 9 and 10 are respectively connected to the point between the seventh resistor R7 and eighth resistor R8 from the high-side reference power supply $T_{rt}$ and to the fifth resistor R5 and sixth resistor R6 from the high-side reference power supply $T_{rt}$ by interlock switches SW3 and SW4. The lower-bit reference-signal lines 9 and 10 are respectively connected to the point between the ninth resistor R9 and tenth resistor R10 from the high-side reference power supply $T_{rt}$ and the point between the eleventh resistor R11 and twelfth resistor R12 from the high-side reference power supply $T_{rt}$ by interlock switches SW5 and SW6. Also, the lower-bit reference-signal lines 9 and 10 are respectively connected to the fifteenth resistor R15 and sixteenth resistor R16 from the high-side reference power supply $T_{rt}$ and to the point between the thirteenth resistor R13 and fourteenth resistor R14 from the high-side reference power supply $T_{rt}$ by interlock switches SW7 and SW8.

When converting the analog signal into upper bit digital signals, the reference voltage generating unit 3 outputs the reference voltages from the upper-bit reference-signal lines 7 and 8, with all the switches SW1 to SW8 set to be off. Also, when converting the analog signal into lower bit digital signals, the reference voltage generating unit 3 outputs the reference voltages from the lower-bit reference-signal lines 9 and 10, with any one pair of switches, among pairs of switches SW1 and SW2, SW3 and SW4, SW5 and SW6, and SW7 and SW8, set to be on.

The comparing unit 4 includes an upper bit comparing unit 11 for comparing the voltage of the analog signal with the reference voltages for the upper bits, and a lower bit comparing unit 12 for comparing the voltage of the analog signal with the reference voltages for the lower bits.

The upper bit comparing unit 11 includes an amplification unit 13 for amplifying a difference between the voltage of the analog signal and each reference voltage, and a compare-and-hold unit 14 for comparing and holding the output of the amplification unit 13.

The amplification unit 13 includes two two-stage amplifiers 17 formed by two differential amplifiers 15 and 16 which are connected in series to each other, and a complementary amplifier 18 which is connected to two differential amplifiers 15 before the stage of the two-stage amplifiers 17, which are adjacent to each other, and which differentially amplifies the outputs of the differential amplifiers 15. The two-stage amplifiers 17 are not limited to a case in which the two differential amplifiers 15 and 16 are connected in series to each other, but can be also formed by three or more differential amplifiers which are connected in series to one another.

Figure 2:
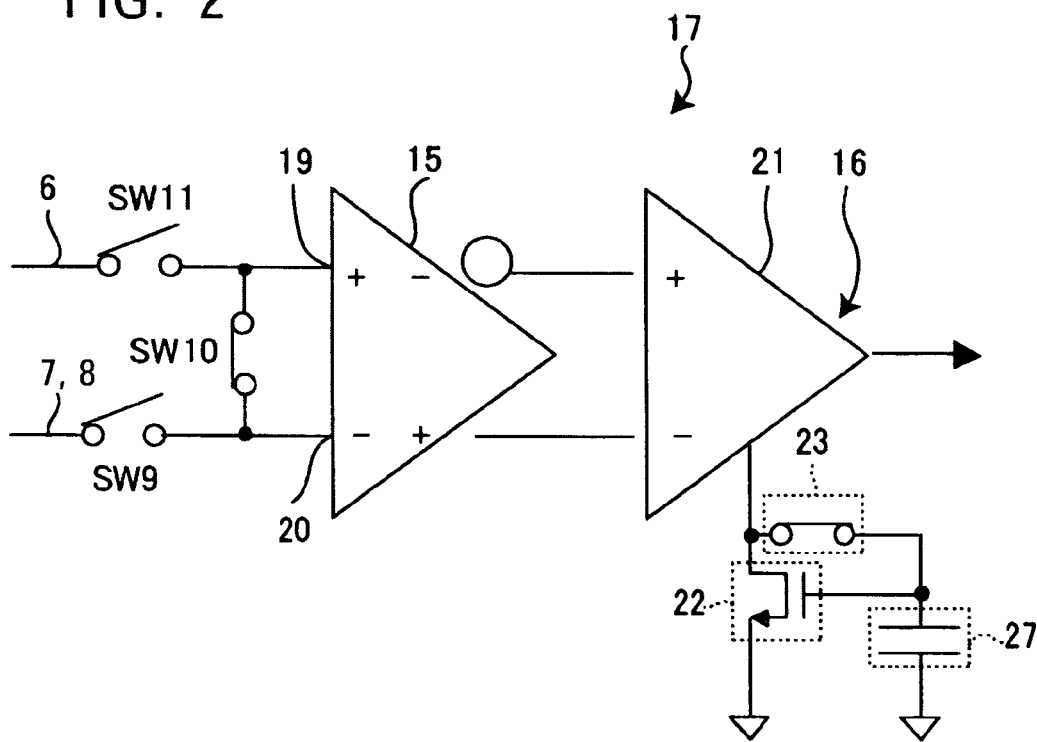
FIG. 2 is a schematic circuit diagram showing an upper bit comparing unit (in a reset mode)
Figure 3:
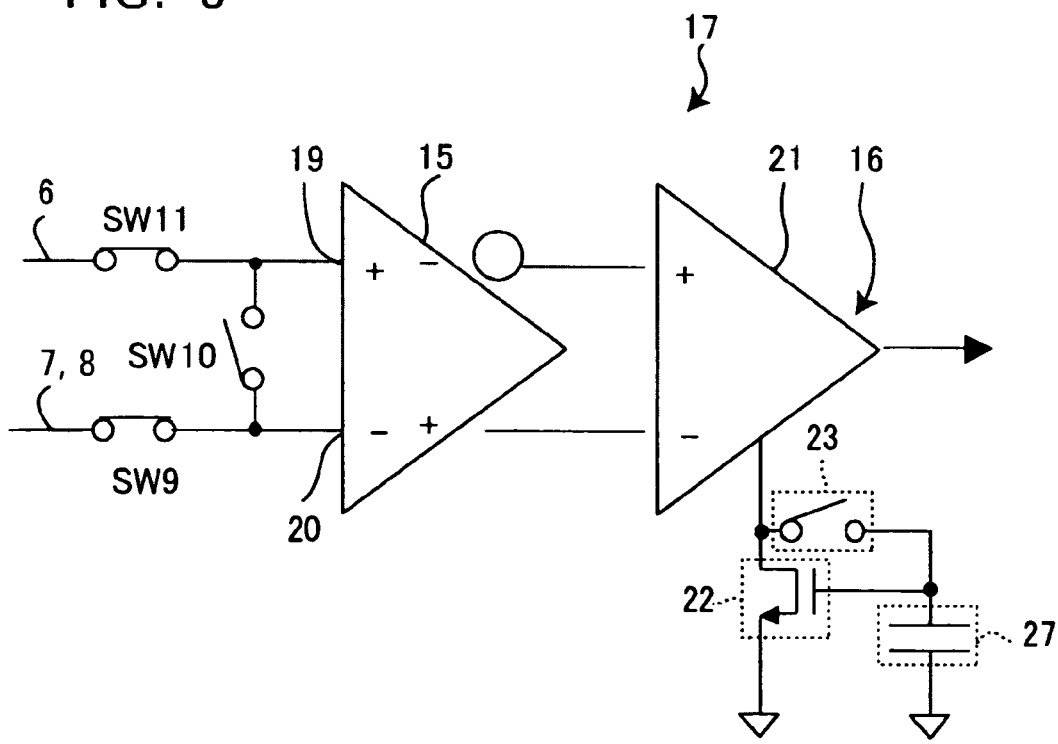
FIG. 3 is a schematic circuit diagram showing an upper bit comparing unit (in a comparing mode)

As FIGS. 2 and 3 show, each two-stage amplifier 17 is formed by connecting the differential amplifiers 15 and 16. The differential amplifier 15 has an in-phase input terminal 19 to which the hold line 6 is connected with a switch SW11 (first switching unit) provided therebetween, and an anti-phase input terminal 20 to which the upper-bit reference-signal line 7 (8) is connected with a switch SW9 (second switching unit) provided therebetween. The in-phase input terminal 19 and the anti-phase input terminal 20 are connected by a switch SW10 as a third switching unit. The switches SW9, SW10, and SW11 are controlled to be on and off by a clock signal CLK.

As described above, the analog signal, which is an input signal input from the hold line 6, is applied to the in-phase input terminal 19 of the differential amplifier 15 in the prestage through the first switching unit (the switch SW11). The reference signal (reference voltage), which is input from the upper-bit reference-signal line 7 (8), is applied to the anti-phase input terminal 20 of the differential amplifier 15 through the second switching unit (the switch SW9). The third switching unit (the switch SW10) is provided between the in-phase input terminal 19 and the anti-phase input terminal 20.

By controlling the switches SW9 and SW11 to be off, as shown in FIG. 2, and controlling the switch SW10 to be on, the present position detecting processor 15 short-circuits the in-phase input terminal 19 and the anti-phase input terminal 20 so that both have a high impedance. Also, as shown in FIG. 3, by controlling the switches SW9 and SW11 to be on and controlling the switch SW10 to be off, the present position detecting processor 15 differentially amplifies a potential difference between the in-phase input terminal 19 and the anti-phase input terminal 20.

Accordingly, while the differential amplifier 15 is not performing an amplifying operation, the in-phase input terminal 19 and the anti-phase input terminal 20 are short-circuited to have a high impedance state. Thus, this can prevent noise generated in the differential amplifier 15 from being superimposed on the input signal and can prevent the lower bit comparing unit 12, which is connected to an upper stage than the differential amplifier 15, from malfunctioning. As a result, the analog-to-digital converter 1 can be stably operated.

The lower bit comparing unit 12 is substantially similar in configuration to the upper bit comparing unit 11, but differs from the upper bit comparing unit 11 in that the switch SW11 is not connected to the in-phase input terminal 19.

In other words, similarly to the upper bit comparing unit 11, the lower bit comparing unit 12 includes an amplification unit 13 for amplifying a difference between the voltage of the analog signal and each reference voltage, and a compare-and-hold unit 14 for comparing and holding the output of the amplification unit 13.

The amplification unit 13 includes two two-stage amplifiers 17 formed by two differential amplifiers 15 and 16 which are connected in series to each other, and a complementary amplifier 18 which is connected to two differential amplifiers 15 before the stage of the two-stage amplifiers 17, which are adjacent to each other, and which differentially amplifies the outputs of the differential amplifiers 15, which is in the prestage. The two-stage amplifiers 17 are not limited to a case in which the two differential amplifiers 15 and 16 are connected in series to each other, but can be also formed by three or more differential amplifiers which are connected in series to one another.

Figure 4:
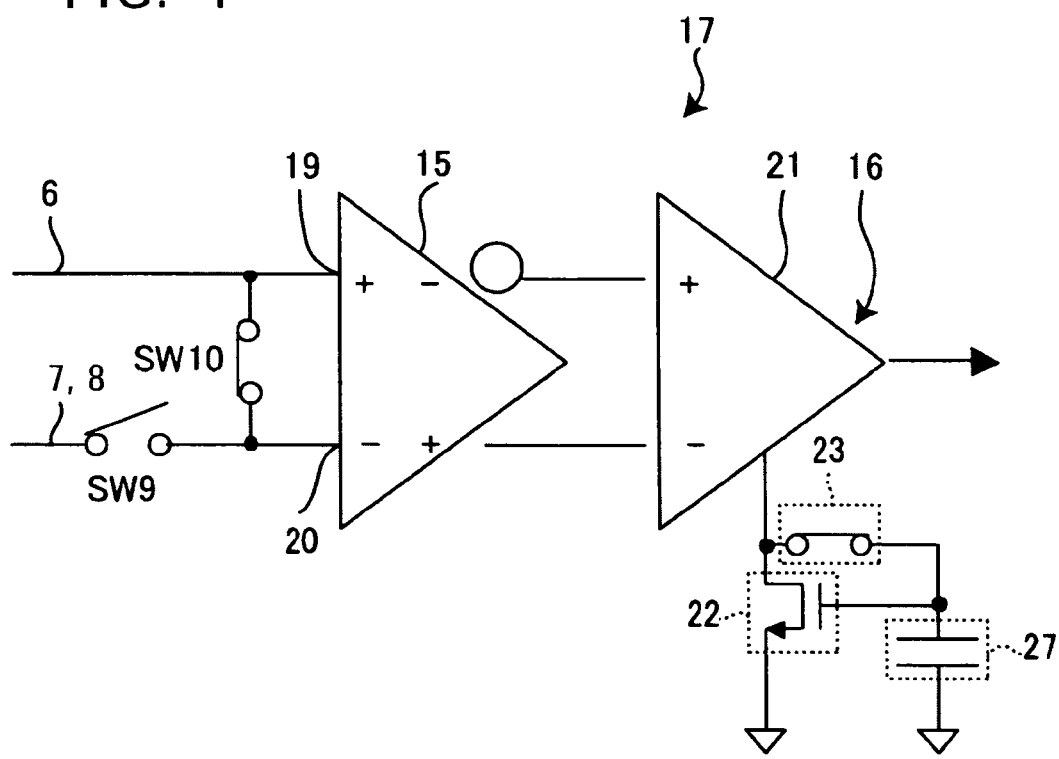
FIG. 4 is a schematic circuit diagram showing a lower bit comparing unit (in a reset mode)
Figure 5:
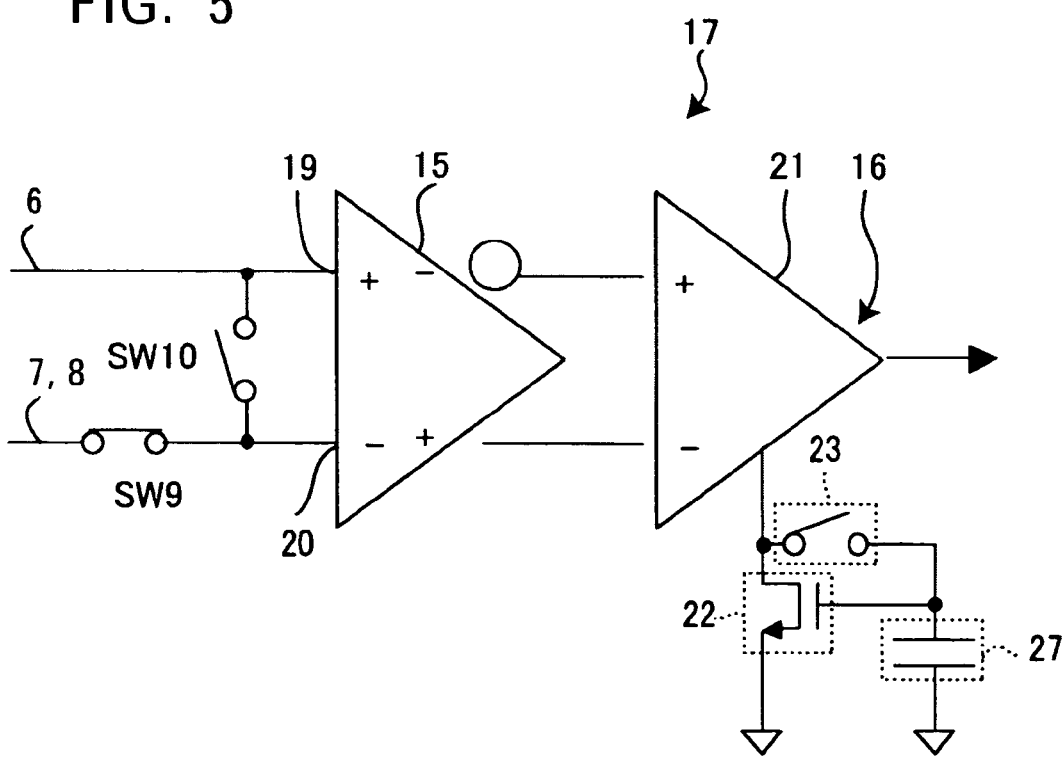
FIG. 5 is a schematic circuit diagram showing a lower bit comparing unit (in a comparing mode)

As FIGS. 4 and 5 schematically show, each two-stage amplifier 17 is formed by connecting the differential amplifiers 15 and 16. The differential amplifier 15 has an in-phase input terminal 19 to which the hold line 6 is connected, and an anti-phase input terminal 20 to which the upper-bit reference-signal line 9 (10) is connected with a switch SW9 provided therebetween. The in-phase input terminal 19 and the anti-phase input terminal 20 are connected by a switch SW10. The switches SW9 and SW10 are controlled to be on and off by the clock signal CLK.

As shown in FIG. 4, by controlling the switch SW9 to be off and the switch SW10 to be on, the differential amplifier 15 in the prestage short-circuits the in-phase input terminal 19 and the anti-phase input terminal 20 so that both have a high impedance. Also, as shown in FIG. 5, by controlling the switch SW9 to be on and the switch SW10 to be off, the differential amplifier 15 differentially amplifies a potential difference between the in-phase input terminal 19 and the anti-phase input terminal 20.

The differential amplifier 16 in the poststage connects a load circuit 22 to a differential amplification circuit 21 and connects a load switching unit 23 to the load circuit 22. The differential amplifier 16 uses the load switching unit 23 to increase or reduce the gain of the differential amplification circuit 21 by switching between an entire load in which the entirety of the load circuit 22 is used as a load on the differential amplification circuit 21, and a partial load in which part of the load circuit 22 is used as a load on the differential amplification circuit 21.

Each two-stage amplifier 17 has an offset-compressing function that superficially compresses an offset voltage of the differential amplifier 15 in the prestage by increasing the gain of the differential amplifier 16 in the poststage.

The specific structure of each two-stage amplifier 17 is described below with reference to FIG. 6.

The differential amplifier 15 in the prestage includes a pair of N-channel transistors T11 and T12 which are differentially connected to each other. The transistors T11 and T12 have gate terminals respectively connected to the in-phase input terminal 19 and the anti-phase input terminal 20. A current supply I1 is connected between the drain terminal of the transistor T11 and a power supply VCC, and A current supply I2 is connected between the drain terminal of the transistor T12 and the power supply VCC. A current supply I3 is connected between each source terminal of the transistors T11 and T12 and the ground GND.

In the differential amplifier 15 in the prestage, transistors T21 and T22 are cascode-connected to the transistors T11 and T12, respectively. In other words, the source terminals of the transistors T21 and T22 are respectively connected to the drain terminals of the transistors T11 and T12, and a predetermined bias voltage Vb1 is applied to the gate terminals of the transistors T21 and T22. This extracts the output of the differential amplifier 15 in the prestage from the drain terminals of the transistors T21 and T22.

An amplitude limiting unit 24 for limiting the amplitude of the output of the differential amplifier 15 is provided between the differential amplifier 15 in the prestage and the differential amplifier 16 in the poststage.

The steering sensor 24 includes load resistors R21 and R22 which are connected to the drain terminals of the transistors T21 and T22, respectively, and a resistor R30 connected between each of the resistors R21 and R22 and the ground GND. The load resistors R21 and R22 limit the amplitude of the output of the differential amplifier 15 in the prestage, and the resistor R30 adjusts a DC operating point of an input signal to the differential amplifier 16 in the poststage to an optimal voltage.

The differential amplifier 16 in the poststage includes cascode-connected P-type transistors T31, T41, T32, and T42 which are differentially connected to one another. The transistors T31 and T32 have gate terminals connected to the outputs (the drain terminals of the transistors T21 and T22) of the differential amplifier 15 in the prestage. A current supply I4 is connected between each source terminal of the transistors T31 and T32, and the source terminals of the transistors T41 and T42 are connected to the drain terminals of the transistors T31 and T32. A predetermined bias voltage Vb2 is applied to each gate terminal of the transistors T41 and T42, and an in-phase output terminal 25 and an anti-phase output terminal 26 are connected to the drain terminals of the transistors T41 and T42.

In the differential amplifier 16 in the poststage, cascode-connected N-type transistors T61, T71, T62, and T72 are connected to the cascode-connected P-type transistors, which form differential pairs, and switching transistors T51 and T52 are connected in parallel to one pair of the transistors T61 and T62 among the cascode-connected transistors T61, T71, T62, and T72, and the switching transistors T51 and T52 are connected in series to the other pair of the transistors T71 and T72.

In other words, the drain terminals of the transistors T61 and T62 are respectively connected to the drain terminals of the transistors T41 and T42. The transistors T61 and T62 have gate terminals, to which a predetermined bias voltage Vb3 is applied, and source terminals respectively connected to the drain terminals of the transistors T71 and T72. The transistors T71 and T72 have source terminals connected to the ground GND. The drain terminals of the transistors T51 and T52 are connected to the drain terminals of the transistors T41 and T42 in parallel to the transistors T61 and T62. The transistors T51 and T52 have gate terminals to which the clock signal CLK is applied, and source terminals to which the gate terminals of the transistors T71 and T72 are connected in series.

In the differential amplifier 16 in the poststage, the cascode-connected transistors T61, T71, T62, and T72 constitute the load circuit 22, and the switching transistors T51 and T52 as switching elements constitute the load switching unit 23.

When the switching transistors T51 and T52 are off, in the differential amplifier 16 in the poststage, the entirety of the load circuit 22 is used as a load (entire load). In this case, the load is a cascode load formed by the cascode-connected transistors T61, T71, T62, and T72, and decreases, thus increasing the gain of the differential amplifier 16 in the poststage. Also, when the switching transistors T51 and T52 are on, part of the load circuit 22 is used as a load (partial load). In this case, the load is caused by a diode load formed by the transistors T71 and T72, and increases, thus reducing the gain of the differential amplifier 16 in the poststage.

In the differential amplifier 16 in the poststage, among the cascode-connected transistors T61, T71, T62, and T72, the transistors T71 and T72, which form the diode load, connect to capacitors C11 and C12 (voltage holding unit 27) which hold voltages applied in the case of the diode load. Specifically, the capacitor C11 is connected between the gate terminal of the transistor T71 and the ground GND, and the capacitor C12 is connected between the gate terminal of the transistor T72 and the ground GND.

Next, the operation of the two-stage amplifier 17 is described below.

The two-stage amplifier 17 alternately repeats a reset mode in which the voltage of the analog signal is applied to the in-phase input terminal 19 and the anti-phase input terminal 20 in the differential amplifier 15 in the prestage by using the clock signal CLK to set the switches SW9 and SW11 to be off and the switch SW10 to be on (See FIGS. 2 and 4) and a comparison mode in which the voltage of the analog signal is applied to the in-phase input terminal 19 in the differential amplifier 15 in the prestage by using the clock signal CLK to set the switches SW9 and SW11 of be on and the switch SW10 to be off (See FIGS. 3 and 5) and in which the reference voltage is applied to the anti-phase input terminal 20.

In the reset mode, the load switching unit 23 (the switching transistors T51 and T52) is set to be on, causing the load on the differential amplifier 16 in the poststage to be formed by the diode load, whereby the gain of the differential amplifier 16 in the poststage can be reduced. In the comparison mode, the load switching unit 23 (the switching transistors T51 and T52) is set to be off, causing the load on the differential amplifier 16 in the poststage to be formed by the cascode load, whereby the gain of the differential amplifier 16 in the poststage can be increased. In other words, in the two-stage amplifier 17, the gain of the differential amplifier 16 in the poststage is greater in the comparison mode than in the reset mode.

As described above, by increasing the gain of the differential amplifier 16 in the poststage, the two-stage amplifier 17 can superficially compress the offset voltage of the differential amplifier 15 in the prestage.

In other words, when the offset voltage of the differential amplifier 15 in the prestage is represented by $V_{os}$, the gain of the differential amplifier 15 in the reset mode (diode load mode) is represented by $G_r$, the gain of the differential amplifier 15 in the comparison mode (cascode load mode) is represented by $G_c$, the output voltage of the differential amplifier 15 is represented by $V_{out}$, and an input voltage in the comparison mode is represented by $V_{in}$, the output voltage $V_{out}$ in the reset mode is represented by $$V_{out} = G_r \cdot V_{os}$$

Also, the output voltage $V_{out}$ in the comparison mode is represented by $$V_{out}=G_c \cdot V_{in}$$

Therefore, an equivalent input offset of the two-stage amplifier 17 can be represented by $$V_{os} \cdot G_r/G_c$$

From the equivalent input offset, it is found that, in the two-stage amplifier 17, the offset voltage of the differential amplifier 15 is compressed $G_r/G_c$ times.

Accordingly, by reducing a gain ratio ($G_r/G_c$) by reducing the gain $G_r$ in the reset mode and increasing the gain $G_c$ in the comparison mode, an offset compressing effect of the two-stage amplifier 17 can be enhanced, thus increasing the accuracy of the comparison mode.

Figure 6:
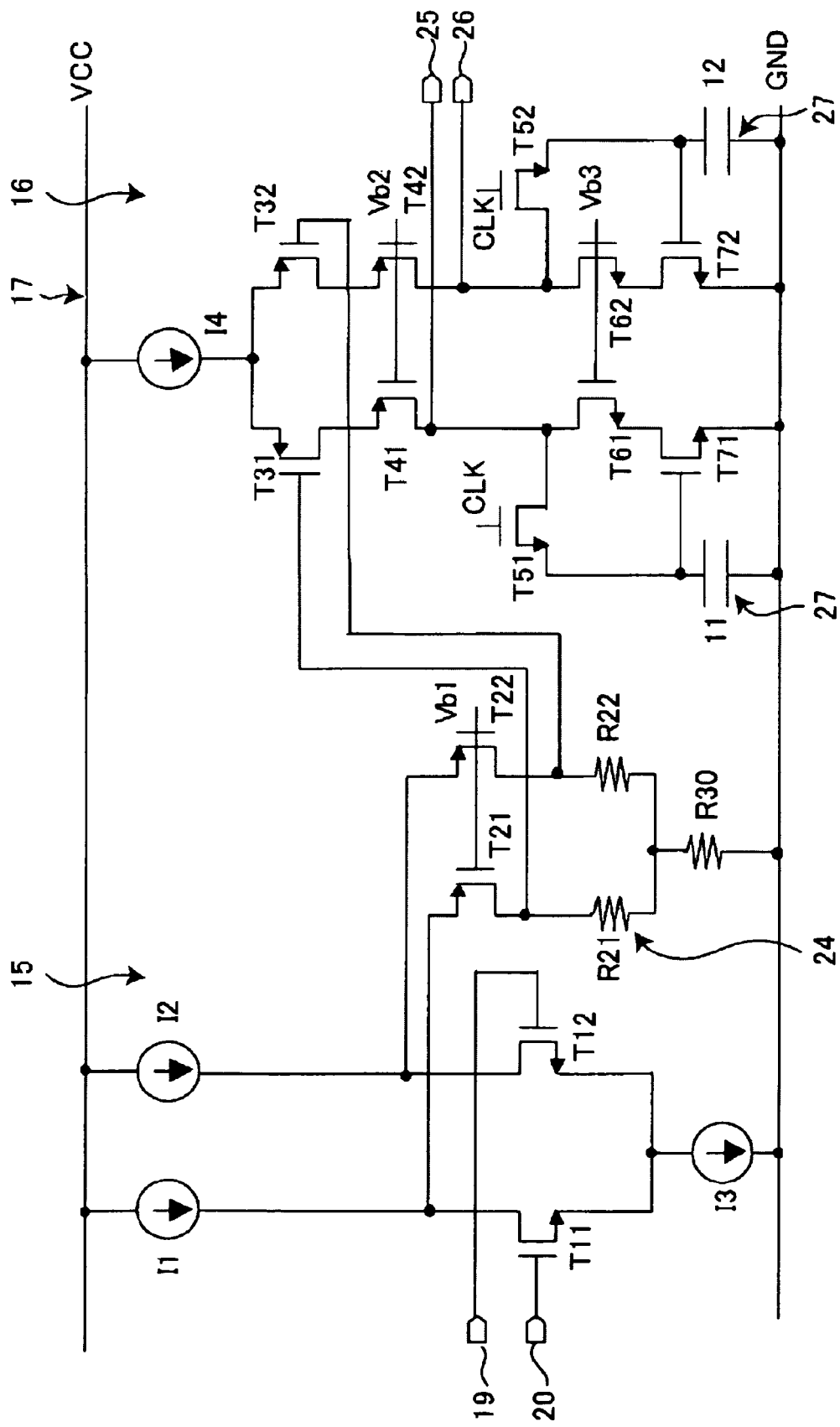
FIG. 6 is a circuit diagram showing an amplifying unit.

In the two-stage amplifier 17 shown in FIG. 6, the gain $G_r$ in the reset mode is represented by $$G_r = A \cdot gm1/gm2$$

where A represents the gain of the differential amplifier 15 in the prestage, gm1 represents the transconductance of the transistors T31 and T32, and gm2 represents the transconductance of the transistors T71 and T72. Thus, to further reduce the gain $G_r$ in the reset mode, the transconductance gm2 of the transistors T71 and T72 may be increased while reducing the transconductance of the transistors T31 and T32. Accordingly, in the two-stage amplifier 17 shown in FIG. 6, based on physical properties, P-channel transistors having a small transconductance are used as the transistors T31 and T32, and N-channel transistors having a large transconductance are used as the transistors T71 and T72. The operating speed in the reset mode and the comparison mode is dominantly determined by the transconductance gm2 of the transistors T71 and T72. Thus, an increase in the transconductance gm2 of the transistors T71 and T72 enables a high speed operation.

Figure 7:
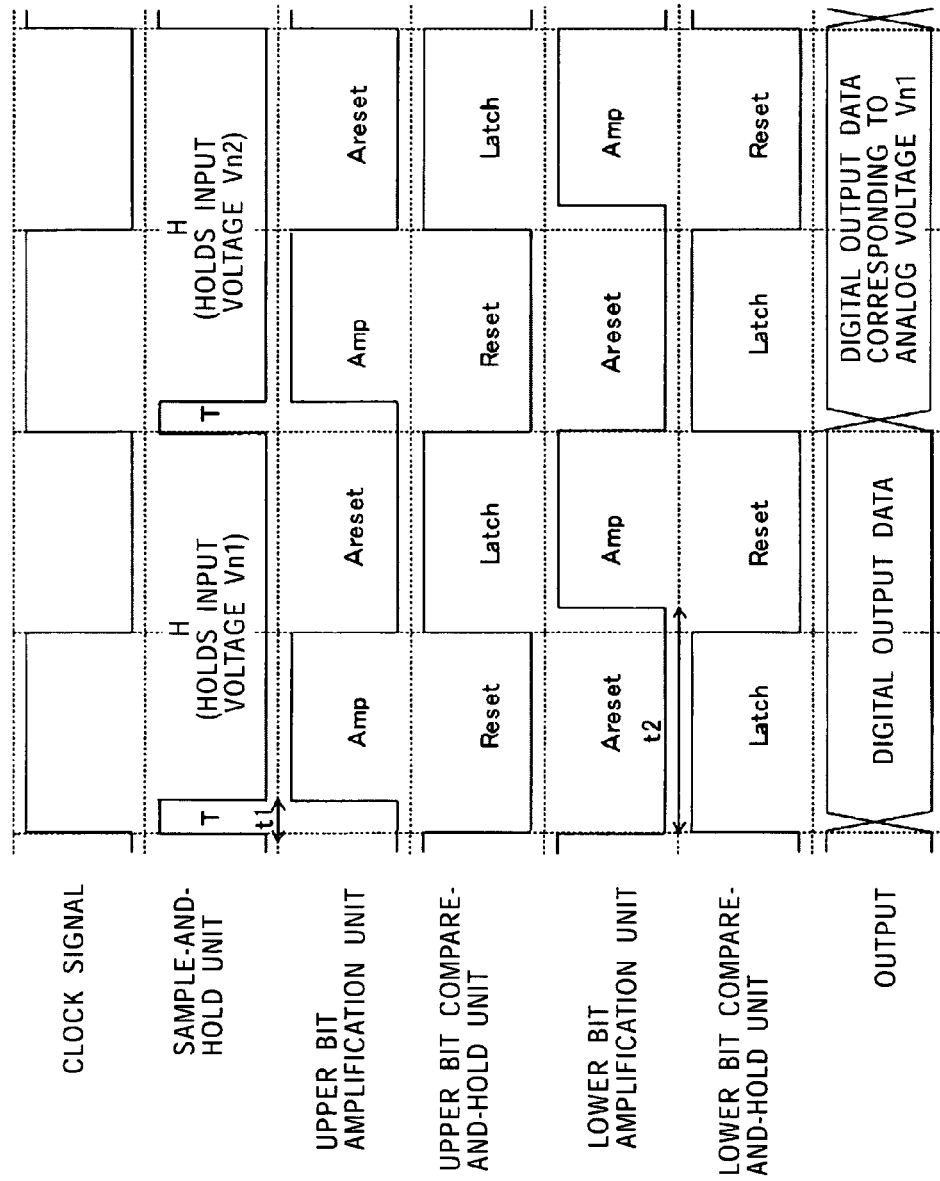
FIG. 7 is a timing chart showing the operation of the analog-to-digital converter shown in FIG. 1.

Next, the operation of the analog-to-digital converter 1 is described below with reference to FIG. 7.

The analog-to-digital converter 1 can operate in synchronization with the clock signal CLK.

The sample-and-hold unit 2 samples the analog signal within a predetermined period (T) in synchronization with a rise of the clock signal CLK, and subsequently holds the sampled analog signal within a predetermined period (H) until the clock signal CLK rises next.

The amplification unit 13 for the upper bits is switched from the reset mode to the comparison mode after a predetermined time (t1) from the rise of the clock signal CLK and amplifies the voltage difference between the voltage of the analog signal held by the sample-and-hold unit 2 and the reference voltage, and is switched again from the comparison mode to the reset mode in synchronization with a rise of the clock signal CLK.

The compare-and-hold unit 14 for the upper bits is reset in synchronization with the rise of the clock signal CLK, and holds the output of the amplification unit 13 in synchronization with a fall of the clock signal CLK.

The logic processing unit 5 generates upper bit digital signals by performing logic processing on the output held by the compare-and-hold unit 14 for the upper bits, and the reference voltage generating unit 3 generates the reference voltages for the lower bits.

Also, the amplification unit 13 is switched from the reset mode to the comparison mode after a predetermined time (t2) from a rise of the clock signal CLK and amplifies the voltage difference between the voltage of the analog signal held by the sample-and-hold unit 2 and the reference voltage, and is switched again from the comparison mode to the reset mode in synchronization with the rise of the clock signal CLK.

The compare-and-hold unit 14 is reset in synchronization with a fall of the clock signal CLK, and holds the output of the amplification unit 13 in synchronization with a rise of the clock signal CLK.

The logic processing unit 5 generates lower bit digital signals by performing logic processing on the output held by the compare-and-hold unit 14, and outputs digital signals, which corresponds the analog signal, after one clock of the clock signal CLK.

Figure 8:
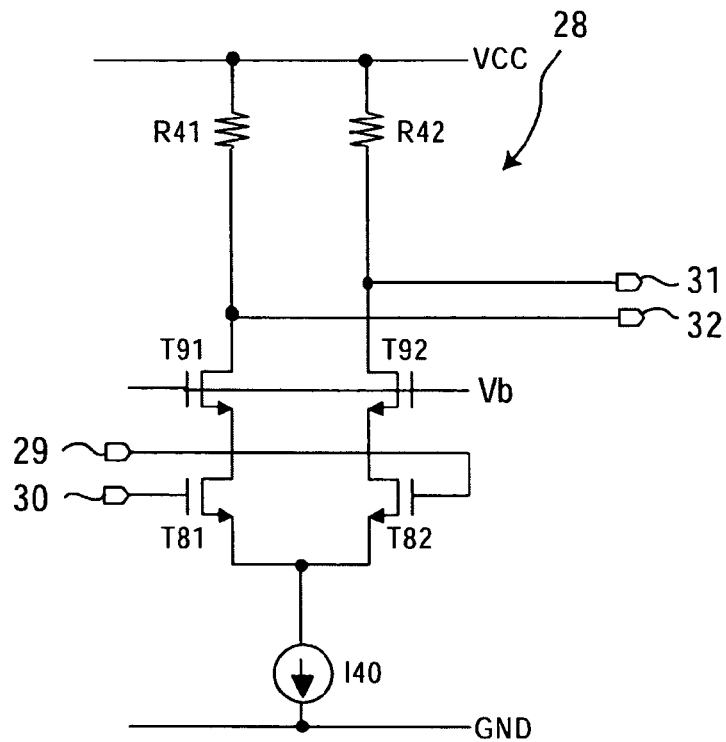
FIG. 8 is a circuit diagram showing another amplifying unit.

In the analog-to-digital converter 1, the two-stage amplifier 17 shown in FIG. 6 is used as the amplification unit 13. As the amplification unit 13, a differential amplifier 28 formed by cascode-connected transistors T81, T91, T82, and T92 which are differentially connected may be used, as shown in FIG. 8. The differential amplifier 28 has input terminals 29 and 30, output terminals 31 and 32, resistors R41 and R42, a current supply I40, and a bias voltage Vb.

Figure 9:
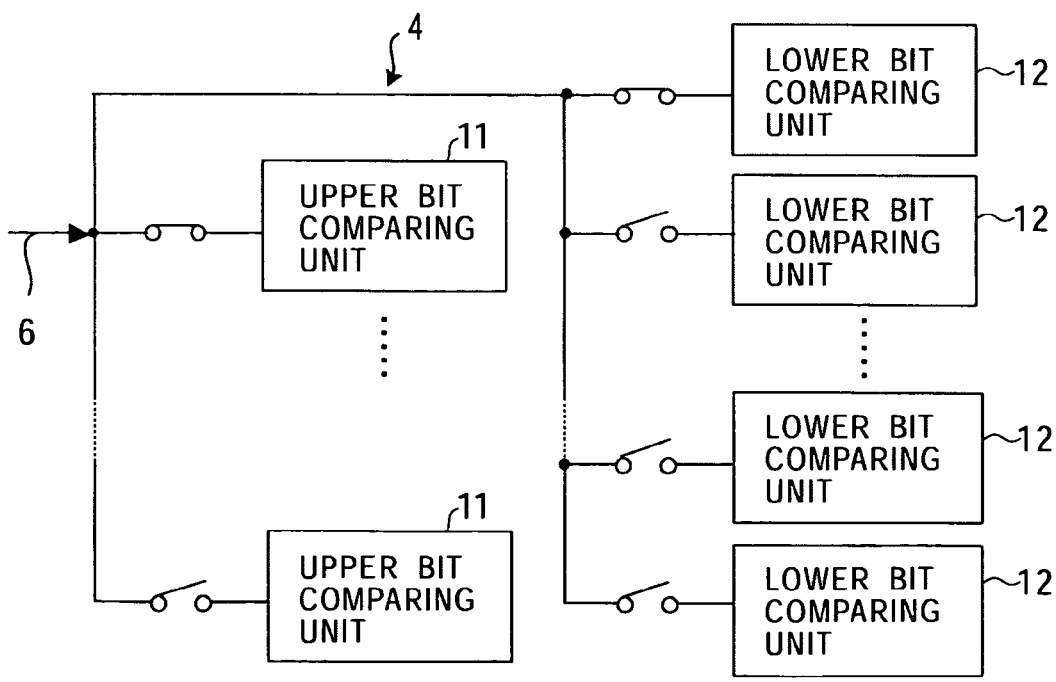
FIG. 9 is a block diagram showing another comparing unit.
Figure 10:
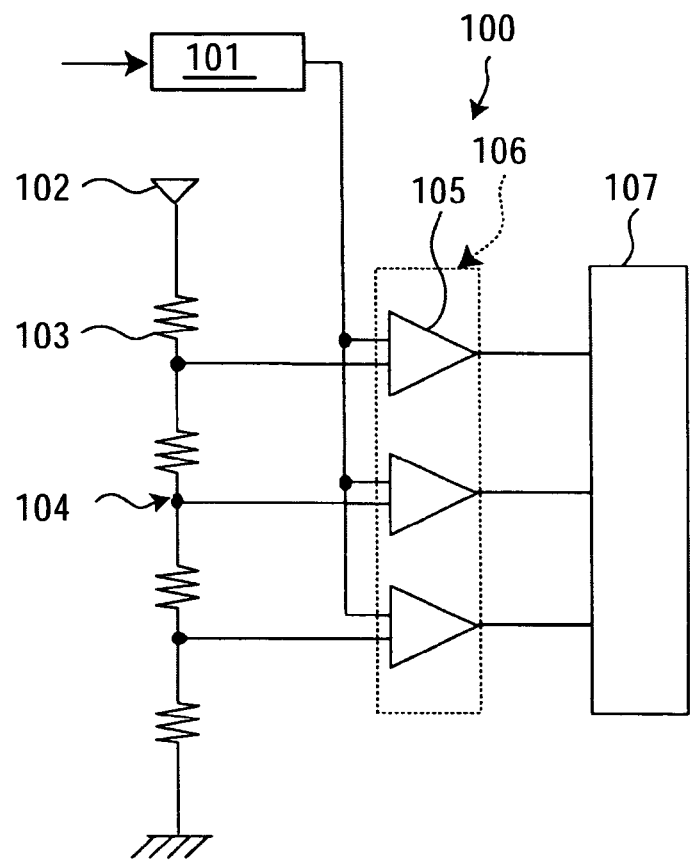
FIG. 10 is a circuit diagram showing an analog-to-digital converter of the related art.
Figure 11:
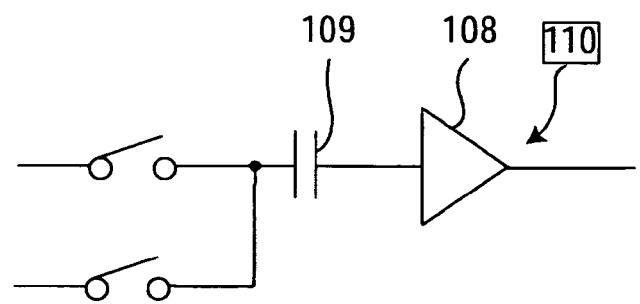
FIG. 11 is a circuit diagram showing a chopper comparator.

As shown in FIG. 1, in the analog-to-digital converter 1, the comparing unit 4 includes one upper bit comparing unit 11 and one lower bit comparing unit 12. As shown in FIG. 9, the comparing unit 4 can achieve an increase in the speed of the analog-to-digital converter 1 by using a plurality of upper bit comparing units 11 and a plurality of lower bit comparing units 12 which are connected in parallel to the hold signal line 6 from the sample-and-hold unit 2 by switches, and sequentially operating the upper bit comparing units 11 and the lower bit comparing units 12. For example, by alternately operating comparing units that operate at two sampling frequencies of 100 mega-samplings/second (MS/s), the analog-to-digital converter 1 can operate at 200 MS/s.

As described above, the differential amplifier 16 can increase or reduce the gain of the differential amplification circuit 21 by connecting the load circuit 22 to the differential amplification circuit 21 and connecting the load switching unit 23 to the load circuit 22, and using the load switching unit 23 to switch between the entire load in which the entirety of the load circuit 22 is used as the load on the differential amplification circuit 21 and the partial load in which part of the load circuit 22 is used as the load on the differential amplification circuit 21.

Accordingly, the circuit size of the load circuit 22 in the differential amplifier 16, whose gain is variable, can be reduced as much as possible.

Also, the load circuit 22 includes the cascode-connected transistors T61, T71, T62, and T72, and has the cascode load as the entire load and the diode load as the partial load. Thus, the load circuit 22 has a simplified configuration causing inexpensiveness, and has reduced size.

In particular, the load circuit 22 is constituted by the cascode-connected transistors T61, T71, T62, and T72, and the load switching unit 23 is formed by a switching element having connection in parallel to one pair of the transistors T61 and T62 among the cascode-connected transistors T61, T71, T62, and T72, and connection in series to the other pair of the transistors T71 and T72, whereby the switching element is set to be on, thus setting the load on the differential amplification circuit 21 to be a diode load. Also, by setting the switching element to be off, the load on the differential amplification circuit 21 is set to be a cascode load. Thus, the differential amplifier 16 has a simplified configuration causing inexpensiveness, and the circuit size of the differential amplifier 16 can be reduced as much as possible.

Since, among the cascode-connected transistors T61, T71, T62, and T72, the transistors T71 and T72, which form the diode load, connect to voltage holding units 27 for holding a voltage applied in the case of the diode load. Even an increase or decrease in the differential amplifier 16 does not change the DC operating point of the differential amplification circuit 21, and the differential amplifier 16 can be stably operated at high speed.

In addition, as described above, the two-stage amplifier 17 includes two differential amplifiers 15 and 16 which are connected in series to each other, and can increase the gain of the differential amplifier 16 in the poststage.

Accordingly, the two-stage amplifier 17 has an offset-compressing function that compresses the offset voltage of the differential amplifier 15 in the prestage. The offset-compressing function can increase the accuracy of the two-stage amplifier 17.

In addition, the two-stage amplifier 17 has a further improved offset-compressing function because the differential amplifier 16 in the poststage is constituted by P-channel transistors, and the cascode-connected transistors T61, T71, T62, and T72 are formed by N-channel transistors.

Also, the amplitude limiting unit 24 for limiting the amplitude of the output of the differential amplifier 15 is provided between the differential amplifier 15 in the prestage and the differential amplifier 16 in the poststage. Thus, the amplitude limiting unit 24 can prevent a large amplitude signal from being input to the differential amplifier 16 in the poststage. This enables an increase in response speed.

As described above, the analog-to-digital converter 1 includes the amplification unit 13 connected to the sample-and-hold unit 2 for sampling and holding the analog signal, and converts the analog signal into digital signals by amplifying a difference between the voltage of the analog signal and each of different reference voltages.

The analog-to-digital converter 1 is formed as a sub-ranging analog-to-digital converter that converts the analog signal in order from upper bits of digital signals by amplifying the difference between the voltage of the analog signal and each reference voltage while gradually narrowing the range of the reference voltages. Thus, the number of the amplification units 13, which connect to the sample-and-hold unit 2, can be reduced, thus reducing the load capacitance of the sample-and-hold unit 2. This enables an increase in the processing speed of the analog-to-digital converter 1 and a reduction in power consumption of the analog-to-digital converter 1.

Also, each amplification unit 13 includes a plurality of two-stage amplifiers 17 each formed by two differential amplifiers which are connected in series to each other, and complementary amplifiers 18 which are connected to the differential amplifiers 15 before the stage of adjacent two-stage amplifiers 17 and which differentially amplify the outputs of the differential amplifiers 15 in the prestage, whereby the amplification unit 13 is formed as a complementary analog-to-digital converter. Thus, the number of amplification units 13, which connect to the sample-and-hold unit 2, can be further reduced, thus reducing the load capacitance of the sample-and-hold unit 2. This enables an increase in the processing speed of the analog-to-digital converter 1 and a reduction in power consumption of the analog-to-digital converter 1.

In addition, since each two-stage amplifier 17 has an offset-compressing function that compresses the offset voltage of the differential amplifier 15 in the prestage by increasing the gain of the differential amplifier 16 in the poststage, the accuracy of the two-stage amplifier 17 can be increased. This can increase a resolution of the analog-to-digital converter 1. The transistors T11 and T12 on the input side of the differential amplifier 15 in the prestage are reduced in size, thus reducing the parasitic capacitances of the transistors T11 and T12, which are directly connected to the sample-and-hold unit 2. Thus, also this can further reduce the parasitic capacitance of the sample-and-hold unit 2, can increase the processing speed of the analog-to-digital converter 1, and can reduce the power consumption of the analog-to-digital converter 1.

In particular, when an amplifier having an offset-compressing function is used as an amplifier for an apparatus requiring a plurality of amplifiers as in the case of the analog-to-digital converter 1, not only the offset voltage of each amplifier can be compressed, but also individual difference in offset voltage of the amplifiers can be decreased as much as possible, thus increasing the apparatus accuracy.

Since the differential amplifier 15 in the prestage includes a differential amplification circuit composed of the transistors T11, T21, T12, and T22, gate-drain mirror capacitance and drain-ground parasitic capacitance can be eliminated. Also this can further reduce the load capacitance of the sample-and-hold unit 2, can increase the processing speed of the analog-to-digital converter 1, and can reduce the power consumption of the analog-to-digital converter 1.

The differential amplifier 16 can increase or reduce the gain of the differential amplification circuit 21 by connecting the load circuit 22 to the differential amplification circuit 21 and connecting the load switching unit 23 to the load circuit 22, and using the load switching unit 23 to switch between the entire load in which the entirety of the load circuit 22 is used as the load on the differential amplification circuit 21 and the partial load in which part of the load circuit 22 is used as the load on the differential amplification circuit 21. Thus, the load circuit 22 in the differential amplifier 16, whose gain is variable, has circuit size reduced as much as possible. Also this can reduce the power consumption of the analog-to-digital converter 1.

As described above, by reducing load capacitors connected to the sample-and-hold unit 2 as much as possible, the power consumption of the analog-to-digital converter 1 can be reduced to its limit and the processing speed of the analog-to-digital converter 1 can be increased. In addition, in the analog-to-digital converter 1, amplifiers each having an offset-compressing function having preferable offset compressing efficiency are used to increase the resolution. In the analog-to-digital converter 1, increased resolution, increased speed, and reduced power consumption are simultaneously realized.

Although the above embodiment describes an example of a sub-ranging analog-to-digital converter which has a total of four bits and which performs conversion two separate times, the embodiment is not limited to the example of the sub-ranging analog-to-digital converter, but may be an analog-to-digital converter having a configuration for performing conversion in a plurality of stages. The analog-to-digital converter 1 is not limited to a single input analog-to-digital converter, but may be a differential input analog-to-digital converter. In addition, specific circuits are not limited to those having only positive supplies, but may be those having positive and negative supplies and those having only negative supplies. Also, specific elements constituting the circuits may be selected as required.

What is claimed is:

1. A two-stage amplifier having an offset-compressing function, comprising a prestage differential amplifier and a poststage differential amplifier, the prestage and poststage differential amplifiers being connected in series to each other, wherein:

the offset-compressing function compresses an offset voltage of said prestage differential amplifier by increasing the gain of said poststage differential amplifier;

the prestage differential amplifier has thereon an in-phase input terminal and an anti-phase input terminal, the prestage amplifier comprises:

a first switching unit provided on an input signal line connected to the in-phase input terminal, a second switching unit provided on a reference signal line connected to the anti-phase input terminal, and a third switching unit provided between the in-phase input terminal and the anti-phase input terminal;

a difference in potential between the in-phase input terminal and the anti-phase input terminal is differentially amplified by setting said first switching unit and said second switching unit to be on and said third switching unit to be off; and the in-phase input terminal and the anti-phase input terminal are short-circuited to have a high impedance by setting said first switching unit and said second switching unit to be off and said third switching unit to be on.

2. An analog-to-digital converter comprising a plurality of amplifying means, wherein:

an input signal is converted into digital form by amplifying differences between an input signal and each of a plurality of different reference signals;

each of said plurality of amplifying means is a two-stage amplifier comprising a prestage differential amplifier and a poststage differential amplifier which are connected in series to each other, and having an offset-compressing function for compressing an offset voltage of said prestage differential amplifier by increasing the gain of said poststage differential amplifier;

each prestage differential amplifier has thereon an in-phase input terminal and an anti-phase input terminal;

each prestage amplifier comprises:

a first switching unit provided on an input signal line connected to the in-phase input terminal, a second switching unit provided on a reference signal line connected to the anti-phase input terminal, and a third switching unit provided between the in-phase input terminal and the anti-phase input terminal:

a difference in potential between the in-phase input terminal and the anti-phase input terminal is differentially amplified by setting said first switching unit and said second switching unit to be on and said third switching unit to be off; and the in-phase input terminal and the anti-phase input terminal are short-circuited to have a high impedance by setting said first switching unit and said second switching unit to be off and said third switching unit to be on.

* * * * *